United States Patent [19]
Bok

[11] Patent Number: 4,622,918
[45] Date of Patent: Nov. 18, 1986

[54] MODULE FOR HIGH VACUUM PROCESSING

[75] Inventor: Edward Bok, Badhoevedorp, Netherlands

[73] Assignee: Integrated Automation Limited, Tortola, British Virgin Isls.

[21] Appl. No.: 656,986

[22] PCT Filed: Feb. 3, 1984

[86] PCT No.: PCT/NL84/00001
§ 371 Date: Sep. 28, 1984
§ 102(e) Date: Sep. 28, 1984

[87] PCT Pub. No.: WO84/03195
PCT Pub. Date: Aug. 16, 1984

[30] Foreign Application Priority Data

Feb. 4, 1983 [NL] Netherlands .......................... 8300351

[51] Int. Cl.$^4$ ..................... B65G 53/16; B65H 20/00; C23C 16/00; C23F 1/02
[52] U.S. Cl. ..................................... 118/718; 118/719; 118/720; 118/733; 156/345; 226/97; 406/88
[58] Field of Search ............... 118/718, 719, 729, 500, 118/723, 726, 733, 720; 226/97, 7; 406/88; 156/345; 204/298

[56] References Cited

U.S. PATENT DOCUMENTS

| | | | |
|---|---|---|---|
| 3,192,845 | 7/1965 | Schmidt | 226/97 |
| 3,588,176 | 6/1971 | Byrne et al. | 406/84 |
| 3,731,823 | 5/1973 | Goth | 406/88 X |
| 3,734,567 | 5/1973 | Fony | 406/88 X |
| 3,976,330 | 8/1976 | Babinski et al. | 406/84 |
| 3,999,806 | 12/1976 | Hurd | 406/181 |
| 4,278,366 | 7/1981 | Loveless | 406/88 |
| 4,403,002 | 9/1983 | Akashi et al. | 118/733 X |
| 4,480,777 | 11/1984 | Suzuki et al. | 226/97 |
| 4,544,446 | 10/1985 | Cady | 156/639 |

FOREIGN PATENT DOCUMENTS

| 43457 | 1/1982 | European Pat. Off. | 406/88 |
|---|---|---|---|
| 8537923 | 4/1981 | Japan . | |

Primary Examiner—Michael R. Lusignan
Attorney, Agent, or Firm—David H. Semmes; Warren E. Olsen

[57] ABSTRACT

Module for processing advancing substrates including an elongated housing enclosing pairs of superposed transporters defining a longitudinal passage; a source of pressurized gaseous transport medium communicating with the longitudinal passage, so as to provide a free floating transport of the substrates through the passage; and a series of processing chambers interposed between the pairs of transporters, so that a non-processing side and a processing side of the advancing substrates are exposed within the processing chamber. A plurality of gaseous transport medium discharge ducts extends laterally across the longitudinal passage above and below the substrates so as to collect and remove excess gaseous transport medium, while assisting the advance of the substrates in the passage. A number of substrate processing means may be employed including ion beam deposition, plasma deposition, plasma etching, sputter etching, ion milling, CVD systems, chrome etching, electron beam annealing, ion implantation electron beam deposition, high vacuum evaporation and reactive ion etching.

11 Claims, 17 Drawing Figures

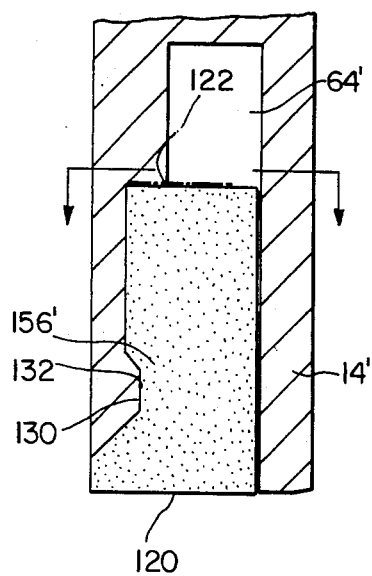 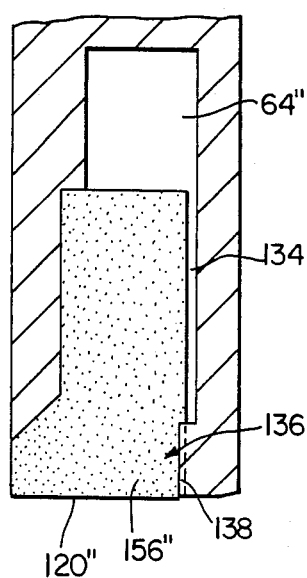 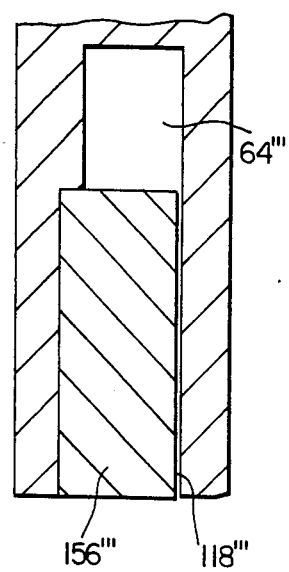
FIG. 9   FIG. 10   FIG. 11
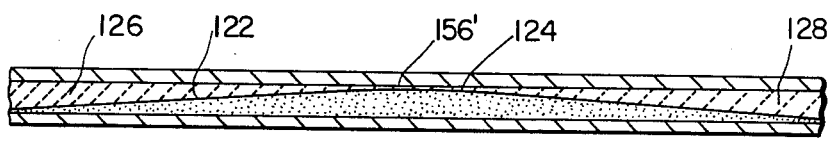
FIG. 12
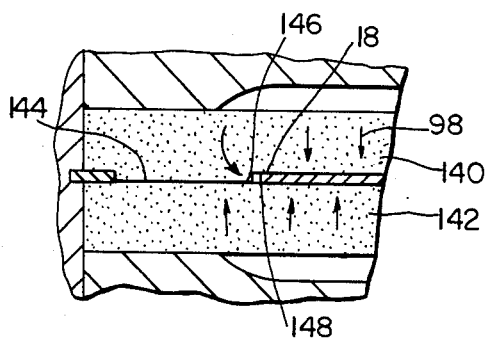
FIG. 13
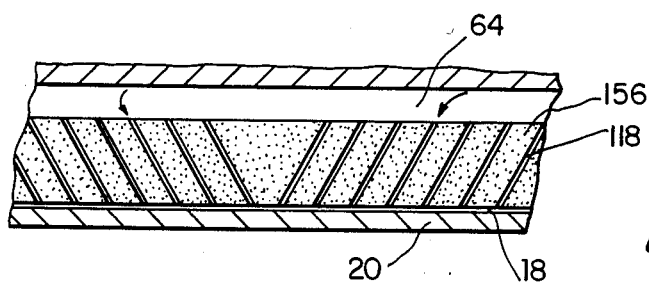
FIG. 14

MODULE FOR HIGH VACUUM PROCESSING

In the Dutch Patent Application No. 8 203 318 of the Applicant modules are described, wherein processing under high vacuum takes place.

In these modules a number of transporters are situated, wherein by means of gaseous medium a "floating" transport of substrates is established and maintained.

Thereby it is shown, that at the processing side of the substrates by means of a vacuum pump at least a great part of the gaseous medium is suctioned off.

The module according to the invention now provides some supplementary structures.

With the processing under a very high vacuum, such as $10^{-8}$ bar, it is required, that the gaseous transport medium, which is used in the transporters for the transport of the substrates by means of gaseous cushions, cannot disturb the very critical processing, taking place within this module.

The module according to the invention is characterized by the transporter sections, positioned at the processing side, on both sides of the supply block, wherein transport medium is supplied to the central passage for the substrates, and discharge channels are located, which at the entrance thereof are in open communication with this transporter passage and at the other end are connected with the module compartments aside the processing chambers.

Thereby by means of walls, situated aside such transporter sections, these discharge channels are almost leak-free separated from the processing area, if during the processing a substrate passes through the transporter passage.

These areas as process chambers communicate through openings in the sidewalls of the module and wide discharge channels connected with a high vacuum pump.

In that way at this processing side the already minimal quantity of gaseous transport medium is withdrawn immediately.

The sidewalls of the discharge channels can be secured together and then function as cover for such a supply block for the deposition of particulates and process material, such as metal particles and particulates, separated from the substrate surface.

Another very positive characteristic of these walls is, that as such walls extend towards at least near the imaginary extension of the passage wall of the supply block, the section thereof, creating a passage-wall section, is enlarged as compared with the adjacent section of these walls.

In that way a considerable amount of the heat, transferred to the substrate during the processing, can be withdrawn through this side wall.

Furthermore, the flow restriction for the gaseous medium, leaking from such a discharge channel, is considerably enlarged, and the gap width between both passage walls of the transporter and the sidewalls of the substrate can be larger.

With a passage width for 3 mm of such a discharge channel and a width of only 40 micrometer for the gap between this wall and the substrate, in that way this gap provides an approximately 10,000 times larger flow restriction for the gaseous transport medium.

In consequence of this a leaking away of this medium to the process chambers is almost completely prevented and whereby the minimal quantity of medium, still leaking away, can be discharged easily though the common discharges aside the processing area and without a disturbing of the processing.

The maintaining in these channels of a considerably higher pressure, as compared to the processing vacuum, also enables the gaseous transport medium, leaking away, to prevent particulates and processing particles to enter this transporter section by deposition on the passage wall of the cover.

Furthermore, in that way also extremely critical passage-wall sections of the supply block remain free of particulates and metal deposition.

A favourable shape of the channel wall is further, provided, such that the wide passage-wall section thereof is to a small degree inclined in the direction of the adjacent smaller sidewall section.

As a result, the distance between this passage-wall section and the supply block can be small, for instance less than 1 mm. Such is of great importance to restrict the dimensions of the combination of supply block and cover in the direction of substrate movement.

It is of importance, that the deformation of the transporters as the result of heating and cooling thereof during the processing remains minimal.

A following positive characteristic is now, that the bearers, which are positioned aside the transporters, also function as a cooling element and at least add to the required cooling of the transporters. Furthermore, that within at least the transporter sections at the processing side the supply of heat towards the passage side of the substrates is approximately the same as the supply of heat towards the oppositely positioned non-passage side of these transporter sections.

Furthermore, the transporters can, as seen in the direction of substrate movement, have a greater width at the mounting therof on the bearers, with a resulting increased heat transfer capacity and an improved mounting thereof.

With the processing under high temperature, as for instance 350°–500° C. with the anisotropic etching and magnetron sputtering, during the processing the temperature of the substrates has to be approximately the same at both the processing side and the non-processing side. This is prevent too large deformation of these substrates as the result of differences in expansion thereof.

A positive characteristic of the module is now, that as during the processing by means of the process medium the processing side of the substrate is heated, also the non-processing side of the substrate is heated, for which purpose for instance a micro-wave—or infra-red heating can be used.

Thereby again and again in both upper and lower sections of the transporters after a short duration of processing a cooling takes place.

In that way is accomplished, that with the use of 30–100 transporters with in between located processing chambers, the changes in temperature in the substrate are restricted and completely allowable.

Furthermore, the temperature of the transporter section at this processing—and non-processing side remains almost the same.

As a result, the processing area can remain free of cooling elements, upon which particulates and metal particles could deposit.

In case a stronger cooling of the transporter sections is required, then the bearers as cooling elements can be connected with each other through cooling channels, which are included in these transporter sections.

Thereby the use of compressed gaseous transport medium as cooling agent, within such cooling channels and the connection via narrow injection channels of the medium supply channels, located in these transporters.

The gaseous transport medium, supplied to the lower side of the passage, mainly serves for maintaining of the gaseous cushion, bearing such a substrate, with a relatively high consumption thereof.

By means of the sharply reduced quantity of gaseous transport medium, leaking away from the transporter discharge channels towards the processing chambers, and the sharply increased direct discharge of this gaseous medium, a processing at the lower side of the passage can take place.

In consequence of this, the deposition of particulates on the substrate surface from the processing can be sharply reduced.

Furthermore, in these transporters on behalf of the supply of the gaseous medium towards the passage, use can be made of the porous segments, as described in the Dutch Patent Application No. 8 300 442 of the Applicant.

In the transporters by means of the gaseous medium again and again a cleaning of the substrate surface can take place. In addition, by means of the processing at the lower side of the substrate passage with the aid of gravity force a removal of loose substrate particles is accomplished.

In that way it is now possible, that a series of substrates join each other in the direction of substrate movement, as they pass through the module for processing thereof and whereby the particulates, loosened from the contact surfaces of these substrates, are efficiently removed and cannot affect the processing.

With an extremely critical processing it is also possible, that the substrates are separately fed through the processing area of the module.

Thereby on command a stop can be brought into the passage, against which a substrate can rest, whereas a foregoing substrate is released from this stop. Due to a somewhat higher speed of the foregoing substrate, this stop is able to move in the established free area twoards its stop position in front of the following substrate.

Thereby use can be made of the porous material and whereby in that case the flow of gaseous medium from this stop acts as a buffer to prevent a mechanical contact of this substrate with this stop.

Following positive characteristics follow from the description of the following Figures:

FIG. 9 shows a detail of a transporter section, provided with a porous segment.

FIG. 10 shows an enlarged detail of a transporter section, provided with another type of porous segment.

FIG. 11 shows an enlarged detail of a transporter section with a segment, in which the sidewall has etched supply channels for the transport-medium.

FIG. 12 is a longitudinal section of the transporter section according to FIG. 9.

FIG. 13 shows a detail of a transporter at the location of the mounting thereof on the bearer.

FIG. 14 shows a detail of a transporter section, in which supply channels are located in the sidewall of the porous segment.

Figure 1:
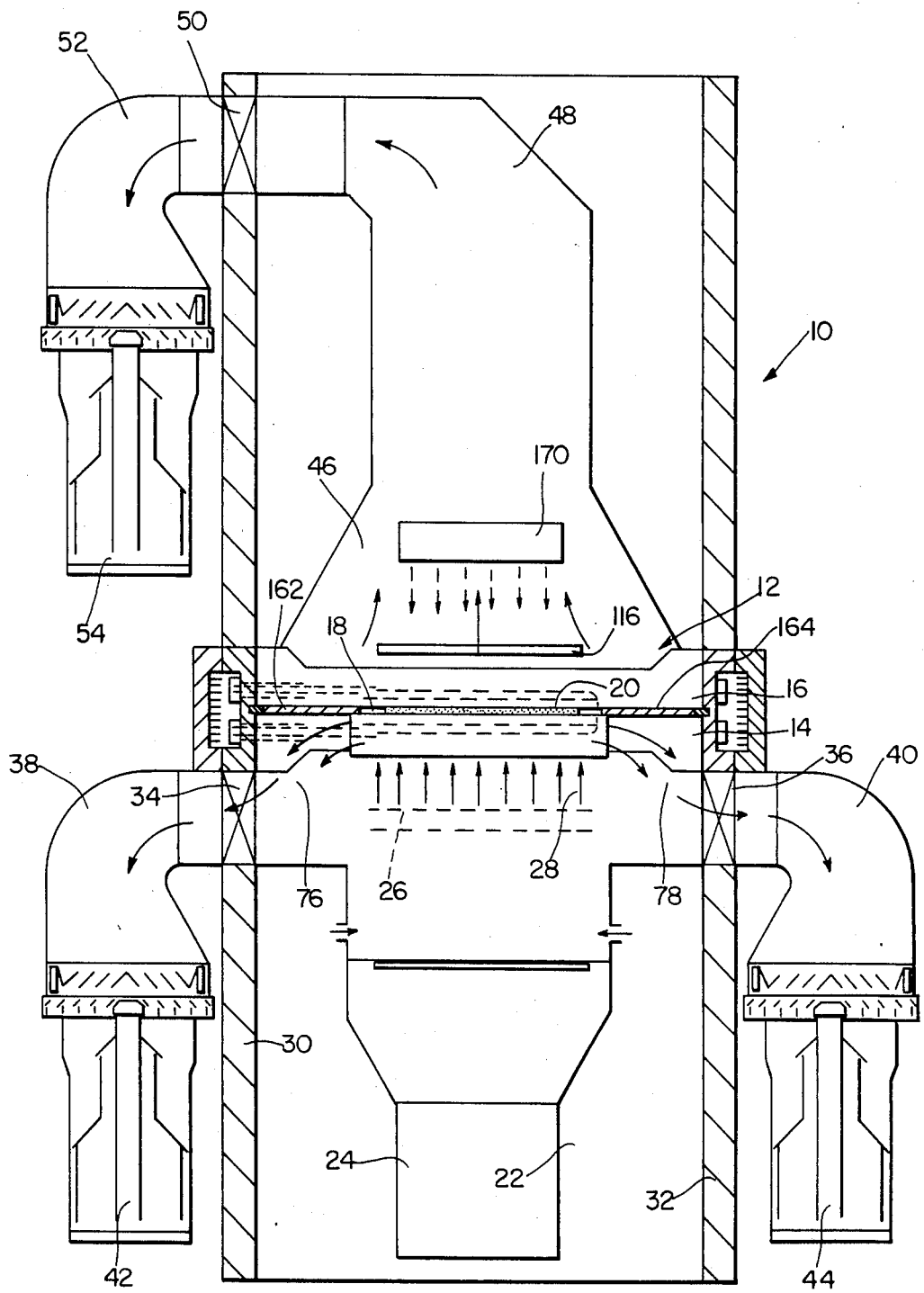
FIG. 1 shows a module according to the invention in a cross sectional view.

In FIG. 1 the module 10 is shown. In this module the transporter arrangement 12 with the lower section 14 and upper section 16 and passage 18 in between for the transport of substrates therethrough are located.

In the lower section 22 of the module at least one source 24 of processing medium is located for the establishing of plasma, ions, electrons, etcetera, on behalf of the processing under high vacuum, such as ion implantation, ion milling, plasma etching, electron beam metal deposition, etcetera, with components and assemblies, belonging thereto, such as targets and electrodes 26, whether or not positioned in the processing compartment 28 at the bottom side of passage 18.

Thereby within the scope of the invention any type of high vacuum—and other processing, using such a transporter arrangement, is possible.

Figure 5:
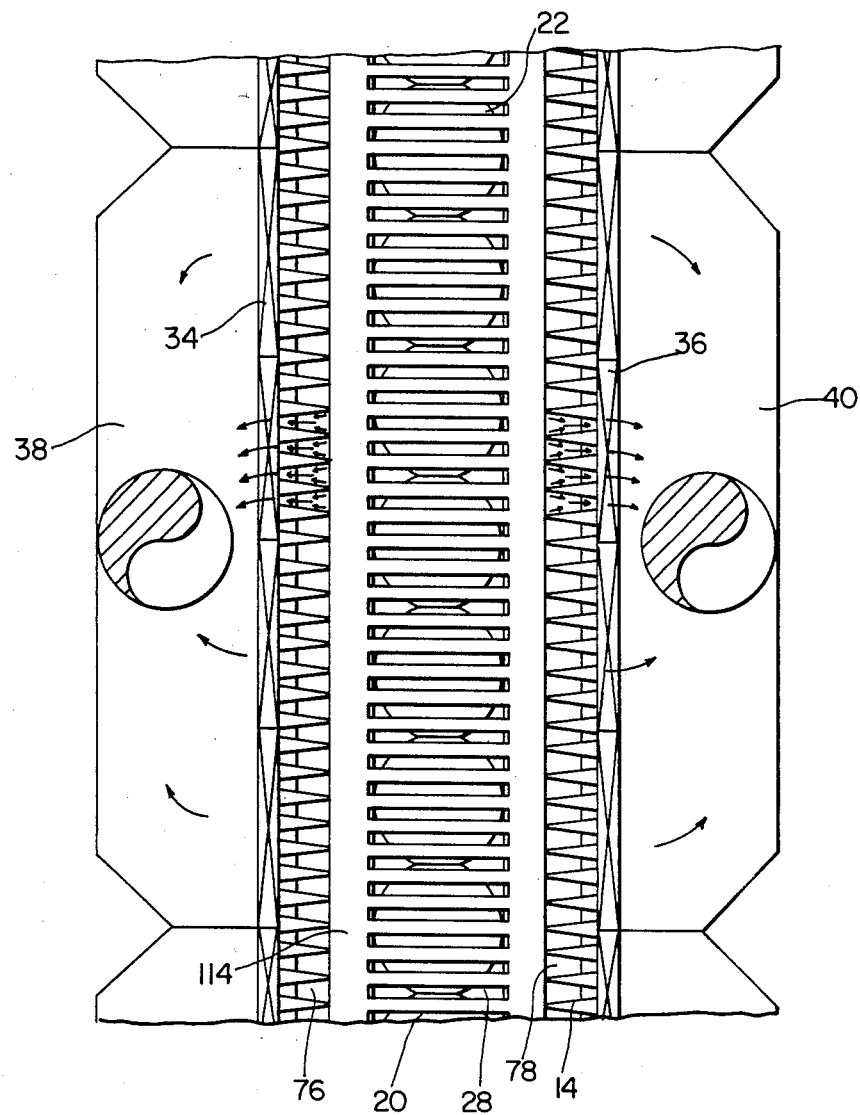
FIG. 5 is a partial longitudinal cross-section of the module according to FIG. 1, with the application of an additional cover structure for the transporters.

In the sidewalls 30 and 32 of the module the openings 34 and 36 are located, to which the ducts 38 and 40 of the respective high vacuum pumps 42 and 44 are connected, see also FIG. 5. By means of these pumps mainly transport medium is suctioned away from the processing side of the module.

The non-processing side 46 of the module is via duct 48, wall passage 50 and duct 52 connected with the high vacuum pump 54 for a discharge of also transport medium as the main agent.

Figure 2:
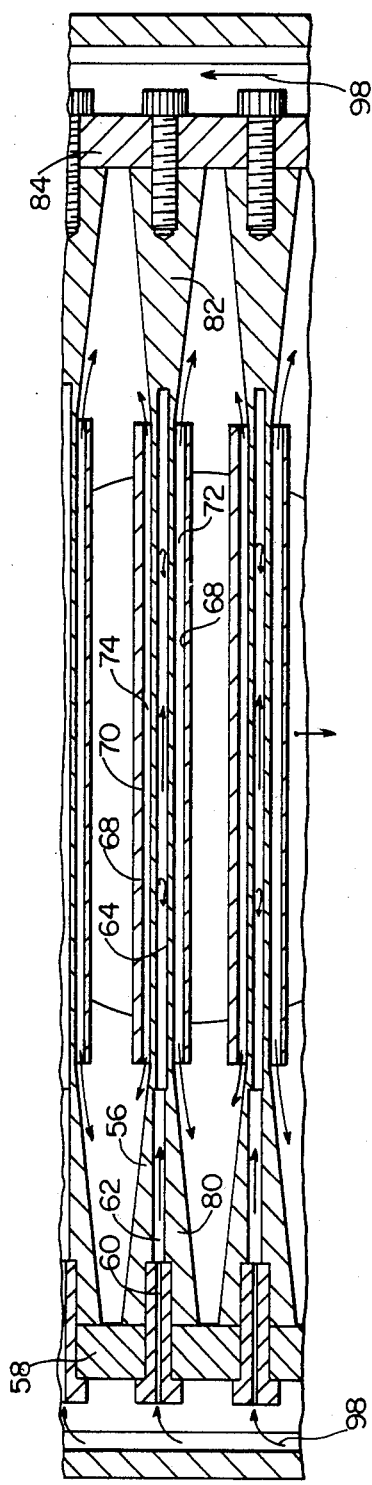
FIG. 2 is a partial cross-section of the module according to FIG. 1 over the processing area thereof.
Figure 3:
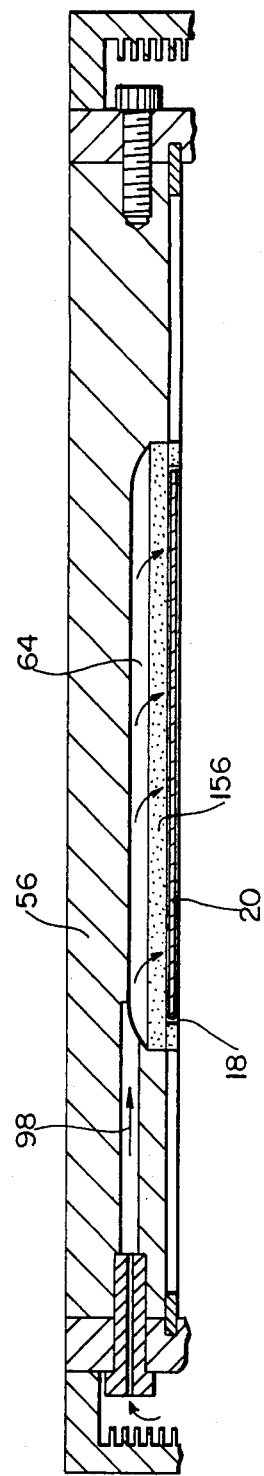
FIG. 3 is a partial cross-section of the module according to FIG. 1 over the transporter section thereof.
Figure 4:
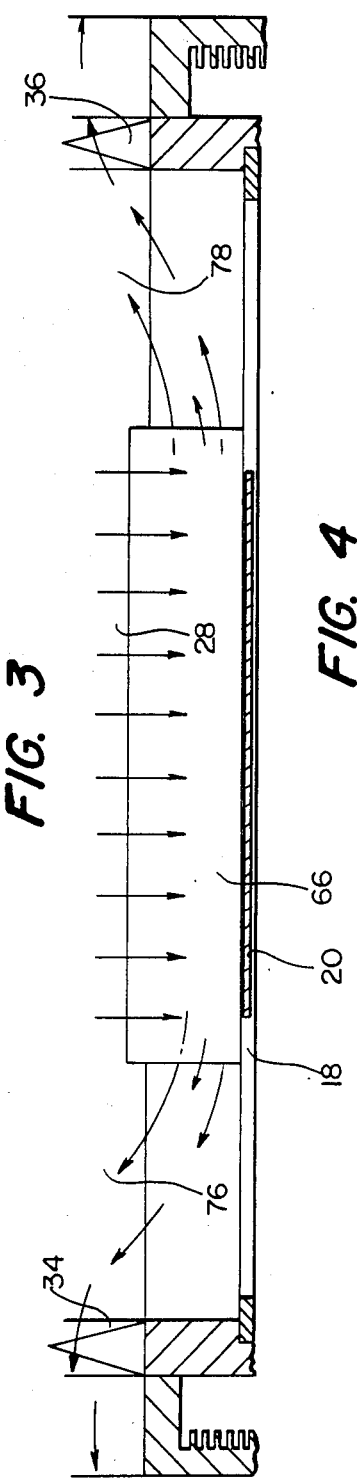
FIG. 4 is a partial longitudinal cross-section of the module according to FIG. 1 over a number of successive transporter sections thereof.

In the FIGS. 2, 3 and 4 the transporter sections 14 are shown more detailed.

In the transporter house 56 the segment 156, made of porous material, functions to supply gaseous medium 98 from the bearer 58, through injection channel 60, supply channel 62 common channel 64 towards passage 18.

The transporter house 56 is surrounded by cover 66 with the sidewalls 68 and 70 thereof, creating the respective discharge channels 72 and 74.

By means of the high vacuum pumps 42 and 44 the medium, urged into passage 18, is suctioned off through these discharge channels along the substrate 20 and through both module compartments 76 and 78 aside the processing compartment 28.

The enlarged ends 80 and 82 of the transporter house 56 enable a thorough mounting of this house and an optimal transfer of heat from this house towards bearers 58 and 84. Compressed transport medium as cooling agent is fed through these bearers as cooling elements.

Figure 6:
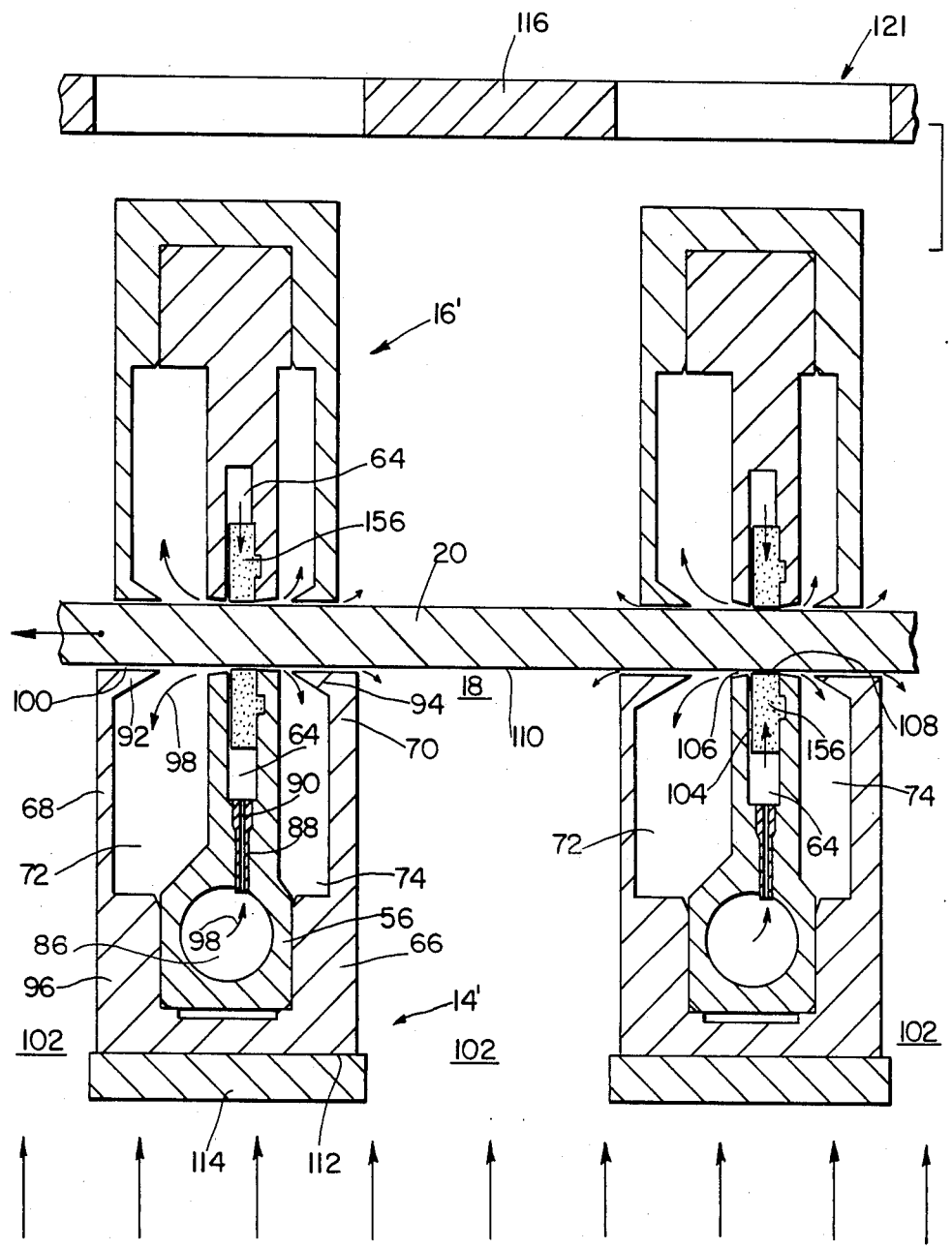
FIG. 6 is an enlarged cross-section of two successive transporters, which can be included in the module according to FIG. 1.

In FIG. 6 the transporter arrangement 14' is shown, within the transporter house 56' the location of a cooling channel 86 for the passing therethrough of the cool transport medium 98 under high pressure. Thereby the common discharge channel 64 is reached via the injection tube 88, having an extremely narrow passage 90, connected with this channel.

The cover 66 is secured to house 56. Thereby the passage-wall sections 92 and 94 are by means of sidewalls 68 and 70 connected with the mounting section 96 of this cover. The wall sections are inclined to facilitate a discharge of medium from the passage 18 towards channels 72 and 74. Thereby the channel 72 is kept wide with a passage width of for instance 3 mm.

Consequently, this channel 72 has a very low flow restriction and such also, because of the very restricted length of for instance only 50 mm of such channel.

Between the passage-wall section 92 and the substrate 20, passing through, a narrow gap 100, with the height of for instance 40 micrometer, can be maintained, in which gap, in combination with a relatively great passage length for the gaseous medium, a considerable flow restriction for the transport medium 98 is established.

Thereby this flow restriction can be 10,000 times greater than that of channel 72. Consequently, a leaking away of transport medium through this gap 100 is almost totally prevented.

In that way in this channel a vacuum of for instance $10^{-4}$ bar can be maintained, without affecting the processing in processing chamber 102, in which the high vacuum can amount to $10^{-8}$ bar and with special processings even $10^{-10}$ bar.

Through the channels, located in the porous segment 156, with in addition channels 104, a supply of this medium takes mainly place from the common channel 64 towards the narrow gap 106 and from there towards discharge channel 72.

Via channel 74 a more restricted discharge of this medium 98 takes place, because gap 108 is smaller than gap 106.

As a result, due to such difference in urging of medium, a resulting thrust is applied by this medium on the substrate 20 in the direction of substrate movement.

Through the large surfaces of the passage-wall sections of both cover 66 and transporter section 14 an effective heat transfer takes place from the processed surface 110 of the substrate, as this surface in the foregoing process chamber 102 is heated by means of the processing, occurring thereon.

The lower section 112 of the transporter section 14 is also heated by this process medium, with consequently a heat transfer from two sides towards the cooling medium 98.

Due to the extremely small distance for the conduction of heat, for instance approximately 6 mm, in combination with the conduction of the heat over the entire processing width in lateral direction of this section, the heat transfer is optimal, with consequently an extremely small difference in temperature between the passage-wall sections 92 and 94 and this lower section 112.

As a result, in both transporter section 14 and in cover 66 almost no deformation due to changes in temperatures takes place, which is of greatest importance for the extremely narrow passage for the substrates, with the micro gaps aside these substrates and the transporter sections.

Against the lower side of the cover 66 one or more removable shields 114 are mounted for the collection therewith of process medium, such as metal particulates. Such a shield can have any shape and can, if required, even surround the whole cover 66 towards near the passage 18.

Furthermore, this shield 114, as located aside the process chamber, can partially or totally shield off the module compartments 76 and 78 aside such chamber and can establish a partial or complete sealing off of these compartments from the module-compartment 22, as is shown in FIG. 5.

The transporter section 16 on top of the passage has almost the same structure, however with the supply channel system 60, 62 and 64 for the segments 156, located therein.

Above these transporter sections 16 an electrode plate 116 is mounted to attract thereon that part of the process medium, that has passed through the processing chambers 102, without hitting a substrate, see also FIG. 1.

With high temperatures for the processing it is required, that during such processing the transporter sections 14 and 16 have almost the same temperature. Such because of the avoiding of deformations in these sections.

To that purpose, in this module one or more ovens 170 are located in the non-processing side 46, which heat these transporter sections 16 in such a way, that the temperature is approximately the same as that of the lower transporter section 14. Furthermore, also the upper surface of the substrates is heated.

Thereby for both transporter sections 14 and 16 almost the same method of cooling, with whether or not a cooling channel 86 located in these sections.

Figure 7:
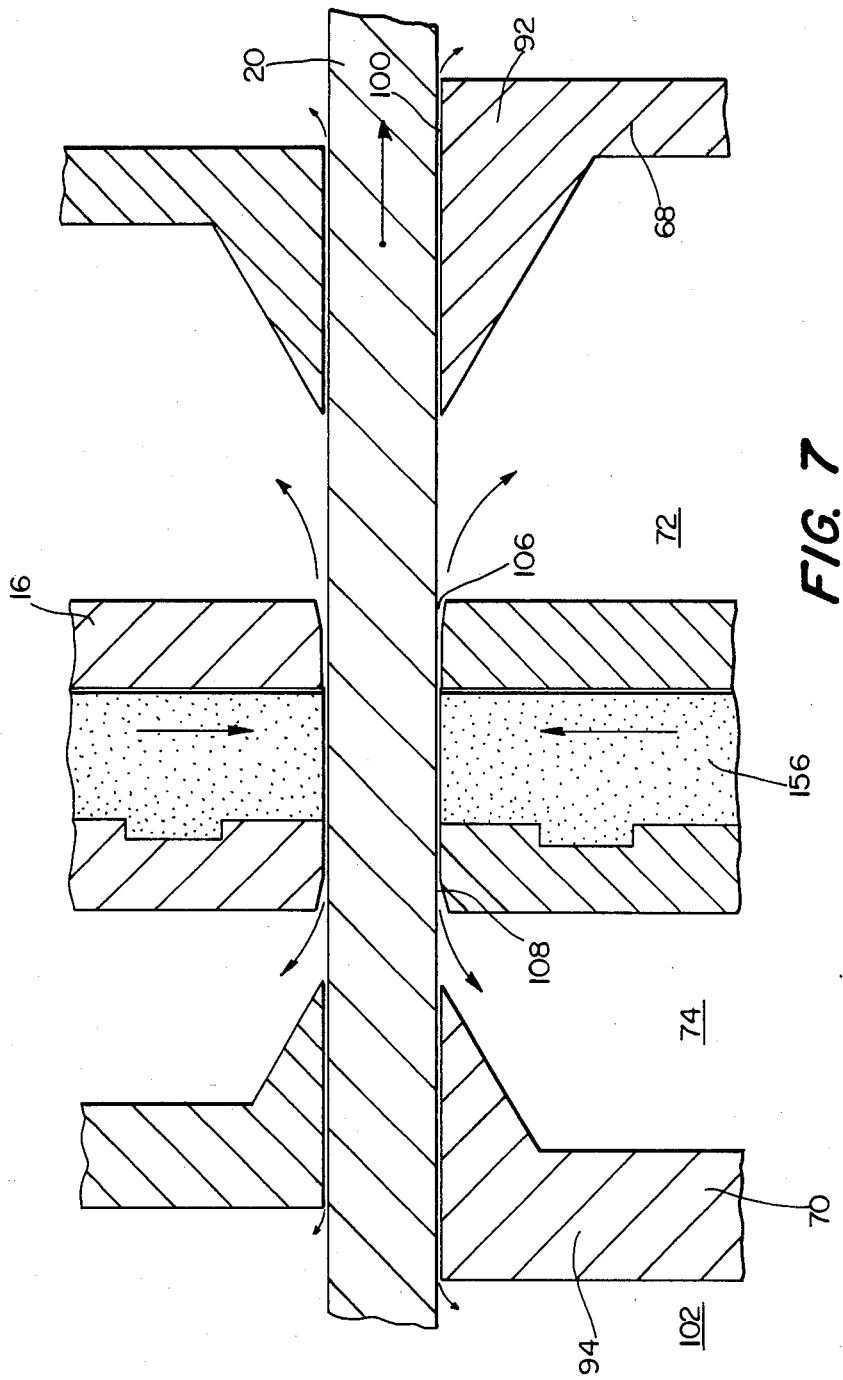
FIG. 7 is an enlarged detail at the location of the passage of the transporter arrangement according to FIG. 6.

In FIG. 7 such a transporter is shown on an enlarged scale at the location of the passage. Thereby the differences in sizes between the various passage gaps and discharge channels become evident.

The substrates 20 displace relatively slowly, for instance 10 mm/sec. Furthermore, the substrate sidewall has a more or less stepped surface, which is due to foregoing processings in other processing equipment. Consequently, this sidewall acts as a considerable obstruction for the medium, escaping through the passage section 106.

Even with an escape speed of 50 mm/sec. at $10^{-5}$ bar, the quantity of escaped medium is still extremely small, for instance 200 mm$^3$/sec. per transporter section, resulting in the negligible amount of 0.2 liter/sec. at $10^{-8}$ bar. Such compared to the available discharge capacity of the vacuum pumps of 5000 liter/sec. or more.

Figure 8:
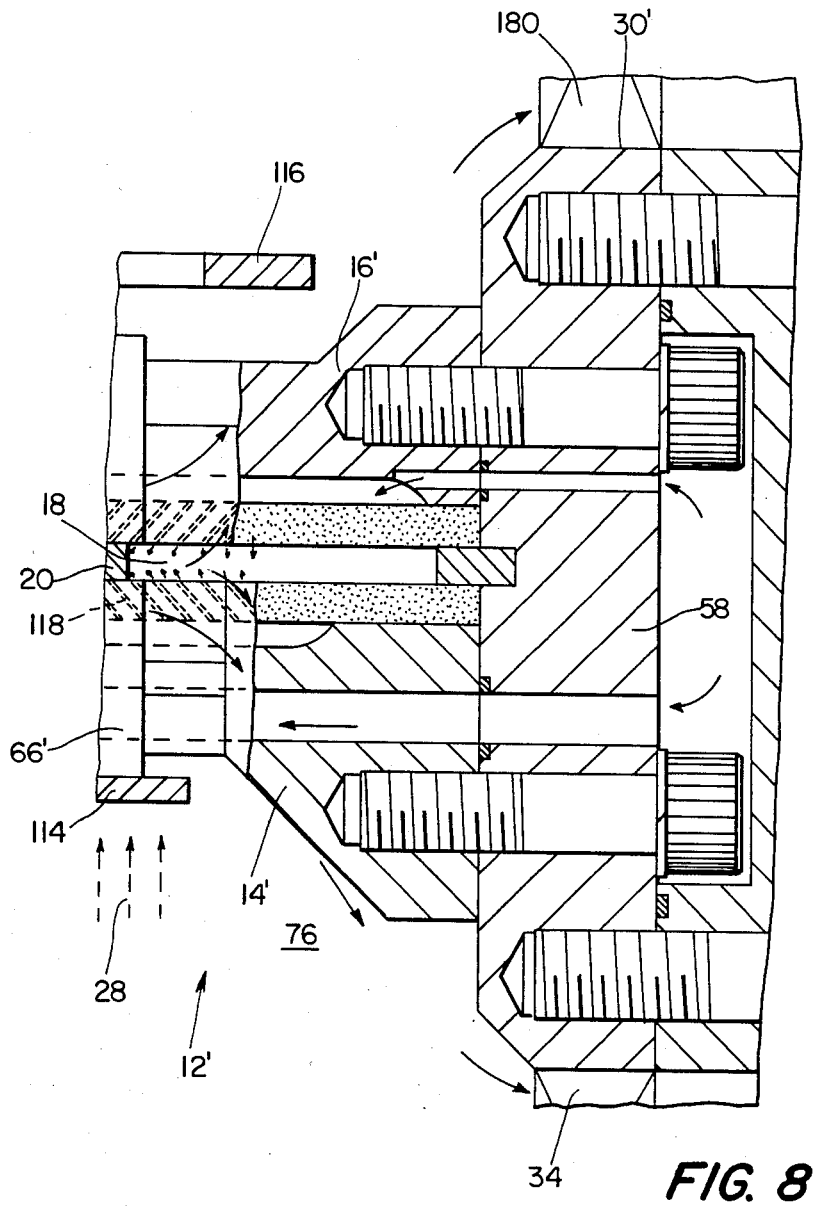
FIG. 8 is an enlarged detail of the mounting of the transporters on the bearers of the module according to FIG. 1.

In FIG. 8 the mounting of such a transporter arrangement 12' on the bearer 58 is shown.

Thereby by means of flows of medium from the inclined channels 118, see also FIG. 14, the substrate 20 is kept in a mid position of passage 18. Such because a removal of such substrate from the center results instantly in equalizing thrusts of these flows of medium on the substrate.

In the sidewall 30' of the module the passage 180 is located, through which part of the transport medium at the non-processing side is withdrawn by a high vacuum pump.

In FIG. 9 another form of the porous segment 156' is shown, whereby this segment for the greater part 120 thereof establishes a passage-wall section. The substrate, moving along, immediately rests upon the gaseous cushion, which is maintained continuously by the flow of medium through the porous material.

Thereby the upper section thereof is partly covered by the layer 122, which is also shown in FIG. 12. In consequence of this, it is possible to have a maximum throughput of medium in the central section 124, whereas this throughput gradually diminishes towards the side sections 126 and 128.

By means of such a restriction in throughput the consumption of medium can be reduced.

Protrusion 130 of house 56 in combination with groove 132, which is located in the sidewall of the segment, provides an enclosure of this segment in the direction towards the passage.

In FIG. 10 the porous segment is shown in still another form 156" and whereby the channel 64" with sections 134 aside the segment extends to near the lower end 120" of this segment.

As a result, via the short section 136 of the porous material transport medium is fed through more easily, with eventually even flows of medium through passages 138, located aside this section 136. These channels can have an inclined position, the same as channels 118, as shown in FIG. 14.

For the porous segment any type of material may be suitable, such as Teflon for the process temperatures at a low level and stainless steel for processing under high temperature, such as 500° C.

In FIG. 11 the segment 156''' consists of solid metal, whereby in the sidewall thereof the channels 118''' are etched, with the outlet of these channels in the supply channel 64'''.

In FIG. 13 the porous segments 140 and 142 extend to near the bearers. Thereby the sidewall-sections 144 fill the passage area 146 on both sides of the centrally positioned passage section 18.

Medium 98, supplied through these segments 140 and 142, flows in an increased amount via the wall section 148 into the passage section 18 and so establishes such a gaseous cushion for the substrates, that a mechanical contact of these substrates with wall section 148 is prevented.

Figure 15:
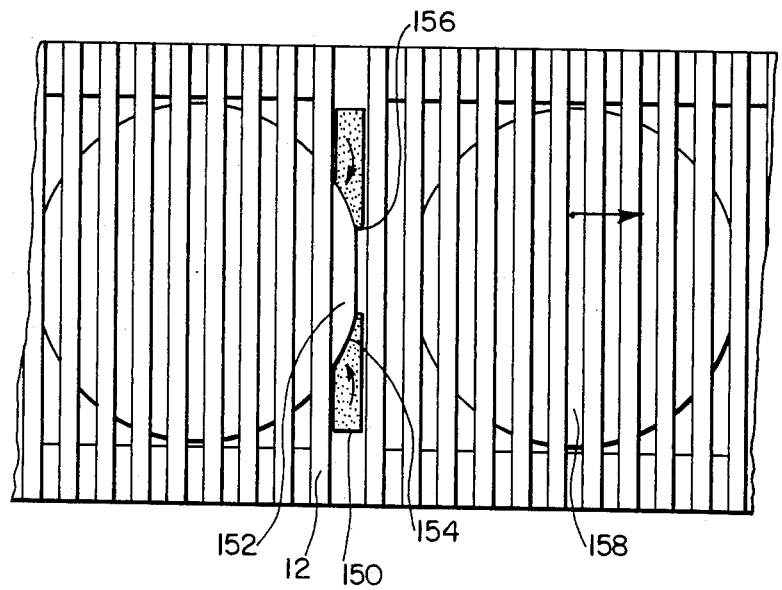
FIG. 15 shows in a top view a transporter arrangement, whereby in between two successive transporters a stop is located, with a substrate resting against it.
Figure 17:
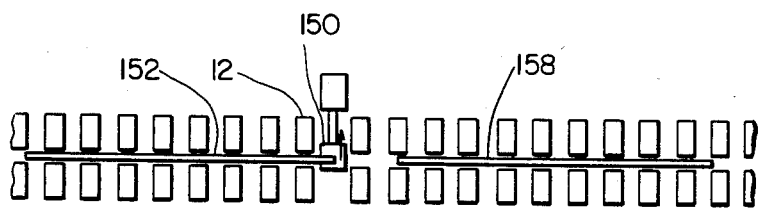
FIG. 17 shows the arrangement according to FIG. 15 in a longitudinal section over successive transporters.

In FIG. 15 in between the successive transporter arrangements 12 the buffer stop 150 is positioned, see also FIG. 17.

In the shown rest position the substrate 152 is urged against the gaseous cushion of the buffer walls 154 and 156. Thereby on command such a cushion is established and is maintained by means of a supply of this medium through the porous material of this stop.

The gaseous flow through this buffer is so large and concentrated, that no mechanical contact of the substrate with the buffer is possible.

In stead of porous material also a stop is possible, in which a segment with channels, located in its sidewalls, is located.

Thereby the substrate 158, located in front, gets the opportunity to displace from this substrate 152. After the attaining of a certain distance in between both substrates, the stop is displaced upwardly over some distance, through which substrate 152 can follow the foregoing substrate.

In another configuration such displacement occurs in a sideways direction.

Figure 16:
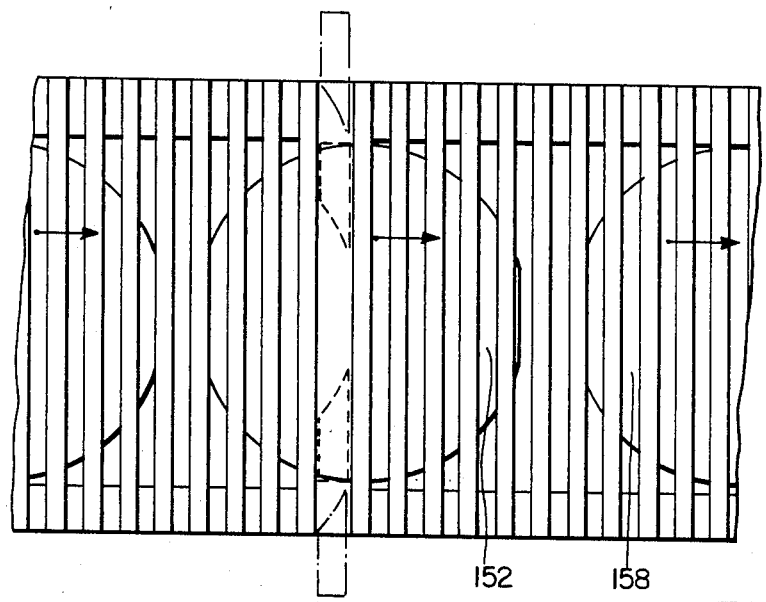
FIG. 16 is the arrangement according to FIG. 15, whereby the stop is withdrawn outside the passage.

Such a displaced stop is shown in FIG. 16, whereby after some time this substrate is displaced so far away from this stop, that the stop can be brought again to its rest position for the stopping of the following substrate.

Because the substrates can move independenty by means of the transport medium, supplied through the transporters and such with a somewhat higher speed, in that way the passing through of the process compartment of the module by these substrates, which are separated from each other, is obtained.

As seen in the direction of substrate movement, such a stop arrangement is located on some distance behind such module section, in which the processing takes place.

It is important, that the gaseous discharge of the transport medium of the transporter sections on the processing side does not function as a discharge for the transport medium of the transporter sections on the non-processing side.

Such because the consumption of gaseous transport medium of this second non-processing section can be considerably larger and can affect the discharge capacity of the discharge ducts of the first section to such extent, that with critical processings under high vacuum this vacuum cannot be reached.

To that purpose, as is shown in FIG. 1, by means of walls 162 and 164, whether or not in combination with sidewall sections 144 of the segments 140, see also FIG. 13, an allowable separation of the processing side from the non-processing side is obtained.

The FIG. 8 shown discharge on both sides of the passage also accomplishes such a sufficient separation.

Within the scope of the invention any type of processing is possible, with also variations in cooling, discharge and cleaning of the process- and transport medium. Furthermore, the removal of particulates can take place by means of water baffles or similar structures, which are placed in the discharge ducts towards the whether or not high vacuum pumps.

Furthermore, in the module also processing can take place of tape as an uninterrupted series of substrates.

Also, more than one type of processing in successive sections of such a module are possible.

It is also possible, that in the module or in the supply- or discharge route thereof a substrate can be moved in sideway direction from the main passage, whereby for that purpose flows of gaseous transport medium can serve and such whether or not in combination with a guide wall, which on command can be brought from its rest position with open passage to a guide position in this passage.

To that purpose, via this guide wall a great number of gaseous flows from supply blocks can at least temporarily be urged upon the substrate. Thereby such a supply block can be positioned in between successive transporter sections.

Within the scope of the invention, by means of the flows of transport medium, the substrate can be displaced independently in the successive transporters, with systems in the module and possibly in both the supply- and discharge route thereof to regulate the speed of such substrate per group of transporters.

To that purpose, in at least some transporter sections in an adapted structure thereof the transport medium, flowing towards the passage, can exercise a resulting thrust on the substrate, passing through their passage section, which is opposite to the direction of substrate movement.

Thereby such a thrust is variable by regulating the supply of the transport medium. In that case in the module sensors are located, which control the speed of such a substrate, with the providing of correction signals to valves, located in the supply route of the transport medium.

To be able to follow the substrates effectively, these substrates can at least locally be provided with an orientation means, such as a layer of metal to precisely determine, in co-operation with the sensors, the successive positions thereof per unit of time. Furthermore, if required, an adaption of the passing through speed of the substrate can take place.

Such an orientation means can be applied on the non-flat, thin sidewalls of the substrate and so do not disturb the processing.

The sensors for the speed control and other sensors can be located in the non-processing side of the module and/or in the supply- and discharge route thereof, with an operation area in between successive transporters.

Furthermore, to prevent the contamination of such sensors, they can have a position in the compartments aside the processing compartment, as seen in lateral direction.

Furthermore, in this module the testing and measuring of the substrates, even during a temporary stand-still thereof, can take place. To that purpose, the type of buffer stops, as shown in FIG. 15, can be used in an adapted version thereof.

Such a testing and measuring can take place within for instance 0.3 second, without the touching of successive substrates.

In that case the test- and measuring sections, which can be positioned in front of the processing compartment or thereafter, are at least the length of a substrate removed from this processing compartment. Such to prevent an affecting of the processing.

Within the scope of the invention also other and eventually additional systems for control, testing, measuring and sorting are possible.

Furthermore, in the module at least locally a "floating" transport can be accomplished by means of a transporter arrangement on only one side of the passage.

I claim:

1. Module for processing advancing substrates comprising:
   a. an elongated housing;
   b. a series of transporter pairs superposed in said housing to define a confined longitudinal passage, said transporter pairs being aligned in the direction of substrate advance within the longitudinal passage, and including:
      (i) a plurality of gas transport medium discharge ducts intersecting said longitudinal passage above and below said substrates and extending laterally away from said longitudinal passage, and
   c. a source of pressurized gaseous transport medium communicating with said longitudinal passage from above and below via a series of transport medium supply ducts intersecting said longitudinal passage so as to provide a free floating transport for substrates advancing therethrough, and
   d. a series of processing chambers interposed between said transporter pairs such that a non-processing side and a processing side of said substrates are exposed therein, said processing chambers including:
      (i) a source of substrate processing medium, communicating with the processing side of said advancing substrates.

2. A module for processing advancing substrates as in claim 1, wherein each said transport pairs comprises a supply block having inner passageways for pressurized gaseous transport medium, said inner passageways communicating with said longitudinal passage both on the processing side of said substrate and on the non-processing side, said supply block passageways and said transporter discharge ducts defining a path for longitudinal free floating advance of said substrates within said longitudinal passage.

3. Module for processing advancing substrates as in claim 2, wherein each said processing chamber includes a discharge duct for gaseous transport medium extending laterally across both the processing and non-processing sides of said longitudinal passage.

4. A module for processing advancing substrates as in claim 3, wherein said discharge ducts are configured such that the greater part of said gaseous transport medium supplied through said transporter sections at the processing side is discharged through said discharge ducts on the processing side of said passage, and the lesser part of said gaseous transport medium supplied on the processing side is discharged through said discharge ducts on the non-processing side of said passage.

5. A module for processing advancing substrates as in claim 4, each said transporter section including at least two parallel laterally extending discharge ducts communicating with said processing chamber.

6. A module for processing advancing substrates as in claim 5, each said transporter section including laterally extending discharge ducts positioned both above said longitudinal passage in the non-processing side of said chamber and below said longitudinal passage in the processing side of said chamber, said laterally extending ducts communicating with gaseous transport medium and processing medium, and an intermediate gaseous transport medium supply duct extending laterally across said longitudinal passage and between said two parallel discharge ducts.

7. A module for processing advancing substrates as in claim 6, said transport section including gaseous medium supply blocks at each side, said supply blocks having inner and outer side walls defining gaseous medium supply ducts extending laterally into said longitudinal passage and gaseous medium and processing medium discharge ducts extending laterally away from said processing chamber.

8. A module for processing advancing substrates as in claim 7, said side walls supporting upper and lower manifolds supported above and below said longitudinal passage and including a plurality of channels communicating with said pressurized gas transport within said longitudinal passage.

9. A module for processing advancing substrates as in claim 8, including a foraminious gate, removably supported in communication with a source of gaseous transport medium and in the path of longitudinal advance of said substrates within said longitudinal passage as a stop for said moving substrates.

10. A module for processing advancing substrates as in claim 8, wherein said transporter sections define gaseous medium flow restrictions above and below the moving substrate within said longitudinal passage, said gaseous medium flow restrictions being more restricted than the restricting gap between substrate and said gaseous transport medium discharge ducts within said transporters, said gaseous transport medium being a cooling medium in contrast to the heat of processing.

11. A module for processing advancing substrates as in claim 10, including a removable shield supported in said housing beneath said longitudinal passage, so as to direct processing media towards processing slots defined intermediate said pairs of transporters and thereby prevent deposition upon said transporters.

* * * * *